United States Patent [19]

Ando

[11] Patent Number: 4,578,564

[45] Date of Patent: Mar. 25, 1986

[54] SERIES-CONNECTED, SKIN-CURRENT HEATING PIPE INCLUDING CURRENT TROUBLE DETECTOR

[75] Inventor: Masao Ando, Yokohama, Japan

[73] Assignee: Chisso Corporation, Tokyo, Japan

[21] Appl. No.: 647,474

[22] Filed: Sep. 5, 1984

[51] Int. Cl.[4] .................. H05B 1/02; H05B 3/00; F16L 53/00

[52] U.S. Cl. .................. 219/301; 137/341; 138/33; 219/10.51; 219/300

[58] Field of Search ............. 219/300, 301, 10.49, 219/10.51; 137/341; 138/33

[56] References Cited

U.S. PATENT DOCUMENTS 3,293,407  12/1966  Ando .................. 219/301 X
3,571,561  3/1971  Ando .................. 219/300

Primary Examiner—A. Bartis
Attorney, Agent, or Firm—Fred Philpitt

[57] ABSTRACT

A series-connected, skin-current heating pipe circuit includes a first ferromagnetic pipe; a first insulated wire extending along and inside the first pipe; a first AC source connected to one end of each of the first pipe and first wire; and an impedance element, such as a resistor, capacitor or reactor connected between the other end of each of first pipe and first wire. A current trouble detector is provided in either line connecting the first AC source to the one end of the first pipe or the one end of the first insulated wire to detect a current trouble due to an insulation problem at any point of the first insulated wire. The circuit may include a second AC source, a second ferromagnetic pipe and a second insulated wire extending along and through the second pipe arranged so that the one end of the first ferromagnetic pipe is connected via the second ferromagnetic pipe, second insulated wire and second AC source to the first AC source and a current trouble detector is connected between a line connecting the first and second ferromagnetic pipes and a wire connecting the first and second AC sources to detect a current flowing therein. An impedance element in the form of a resistor, capacitor or reactor may be connected in circuit between the second ferromagnetic pipe and the second insulated wire.

16 Claims, 5 Drawing Figures

SERIES-CONNECTED, SKIN-CURRENT HEATING PIPE INCLUDING CURRENT TROUBLE DETECTOR

FIELD OF THE INVENTION

This invention relates to a series-connected, skin-current heating pipe and more particularly to an improvement in a detection system for detecting electric current trouble due to an accidental dielectric breakdown or short circuit of an insulated wire extending along and inside the pipe to form a series circuit.

BACKGROUND OF THE INVENTION

A series-connected, skin-current heating pipe herein defines a system including a pipe made from a ferromagnetic material (steel pipe, for example) and a wire which extends along and inside the pipe wall and is generally insulated from the pipe wall, with one end of the pipe and wire connected to two terminals of a single-phase a.c. source respectively, and with the other ends thereof connected each other. Such a skin-current heating pipe is disclosed in U.S. Pat. No. 3,293,407.

FIG. 1 shows a fundamental arrangement of a series-connected, skin-current heating pipe which has been widely known in the art. Reference numeral 1 designates a ferromagnetic steel pipe, 2 denotes an insulated wire extending along and inside pipe 1, and 3 refers to an a.c. source. Wire 2 and steel pipe 1 are connected in series with respect to power source 3. The skin depth S(cm) of the alternating current is expressed by:

$$S = 5030\sqrt{p/\mu f} \qquad (1)$$

where $\mu$ is the specific magnetic permeability of steel pipe 1, p($\phi$cm) is the resistivity, and f is the a.c. source frequency. If the wall thickness t(cm) of pipe 1 is selected to be:

$$t > 2S \qquad (2)$$

it is considered that the alternating current flows along the inner periphery of pipe 1 within the substantially uniform depth S from the inner surface thereof and never leaks outside the steel pipe, thus providing a reliable heating pipe system.

The alternating current should be uniform throughout wire 2. However, in the event that a dielectric breakdown (short circuit) occurs at position 6, for example, in insulated wire 2 of FIG. 1, current $i_1$ of the circuit at one side of the position 6 not including a.c. source 3 decreases below current $i_2$ of the remainder of the circuit including a.c. source 3. In this respect, current transformers 4 and 5 are usually provided to measure and detect the difference between currents $i_1$ and $i_2$ so as to actuate a protective relay to open and protect the circuit against a dielectric breakdown at any point of the wire 2.

The current trouble detection system of FIG. 1 is considered suitable for use in a heating pipe system which is relatively short, namely up to several hundred meters. However, if the pipe system is as long as several kilometers, the detection system of FIG. 1 is unreliable and expensive because it requires an extremely long conductive wire for current difference detection by current transformers 4 and 5.

The present inventor attempted to overcome the drawback of the detection system of FIG. 1 and proposed an invention disclosed in Japanese Patent Office Gazzette No. 14018/1974 (Pat. No. 753,736) which is outlined hereinbelow, referring to FIG. 2.

A steel pipe which corresponds to pipe 1 of FIG. 1 is divided into two parts, one of which is relatively short pipe 15 to serve as a reference pipe and the other is a relatively long pipe 7 to form a main pipe. Between the two pipes are interposed detectors 10 and 10' for detecting the difference between currents $i_1$ and $i_2$ to find a current trouble in the heating pipe system when a dielectric breakdown 11 occurs in wire 8 extending along and inside pipe 7.

It should be noted here that current difference detector 10 or 10' is not accurate in detection of the current difference if the difference between currents $i_1$ and $i_2$ is less than 2%, thus causing unreliable protection of the system. More specifically, if the entire length of main pipe 7 is 1 and the length of an end portion 19 (from the dielectric breakdown position 11 to one end of main pipe 7 more remote from reference pipe 16) is $x (0 \leq x \leq 1)$, current $i_1$ in main wire 8 is substantially inversely proportional to the remainder of main pipe 7, namely $1-x$. If length x is less than 2% of the entire length of main pipe 7, the decrease of the current, namely $i_2 - i_1$, due to the dielectric breakdown will be less than 2% of current $i_2$. Thus, the system is not reliably protected because of a possible detection error of detector 10 or 10'.

From this point of view, the prior invention by the present inventor proposed to increase the thermal stability and the voltage resistance of the insulating layer of the wire corresponding to end portion 19 and of reference wire 16 in the attempt to eliminate dielectric breakdown in these ranges.

This proposal is certainly inexpensive as compared to the arrangement of FIG. 1 if it is applied to heat and keep warm a pipeline wherein reference pipe 15 will be several tens meters long, main pipe 7 is 10 kilometers long, for example, and hence end portion 19 to be increased in thermal stability and voltage resistance of the insulating layer thereof will be 200 meters long approximately. However, it is impossible to completely eliminate dielectric breakdown at these positions despite the increased thermal stability and voltage resistance of the insulating layer, and the prior invention still involves the same problem that the detector will fail to detect such a dielectric breakdown, even if rare, at the said positions.

OBJECT OF THE INVENTION

It is therefore an object of the present invention to overcome the drawbacks involved in the prior art, by providing a current trouble detecting system in a series-connected, skin-current heating pipe system, capable of detecting dielectric breakdown at any point throughout the entire length of the wire passing along and inside the pipe.

SUMMARY OF THE INVENTION

This object is attained by a series-connected, skin-current heating pipe circuit comprising:
 first ferromagnetic pipe;
 first insulated wire extending along and inside said first ferromagnetic pipe;
 first a.c. source connected to end of each of said first ferromagnetic pipe and said first insulated wire;

first impedance element connected between the other ends of said first ferromagnetic pipe and said first insulated wire; and current trouble detecting means provided in the proximity of said first a.c. source to detect a current trouble due to an insulation trouble at any point of said first insulated wire.

The invention will be better understood by the description given below by way of preferred embodiments illustrated.

DETAILED DESCRIPTION OF THE PREFERRED EMBODIMENTS

Figure 3:
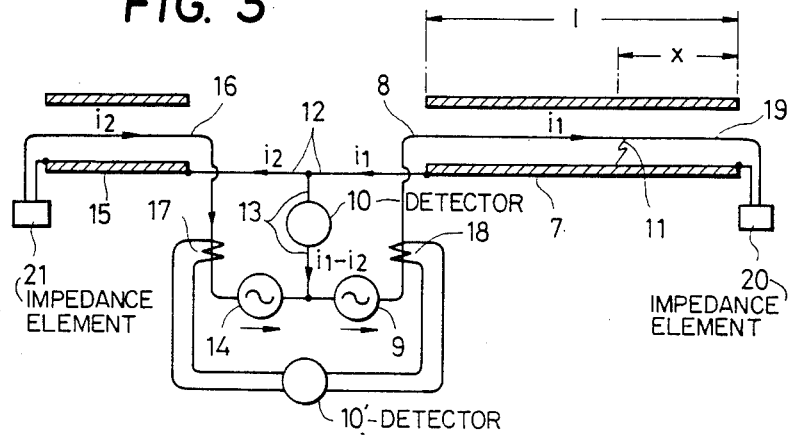
FIG. 3 shows a circuit arrangement of a series-connected, skin-current heating pipe system embodying the present invention.
Figure 4:
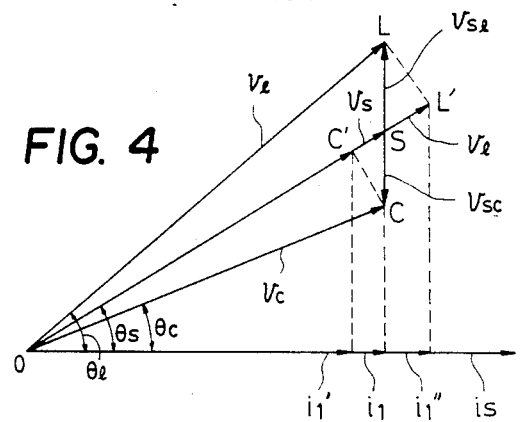
FIG. 4 shows vectors of voltages and currents in the wire proximate to a power source 9 of FIG. 3.
Figure 5:
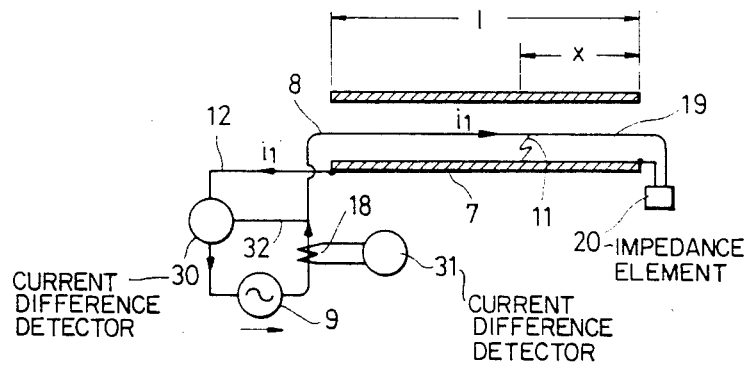
FIG. 5 shows a further circuit arrangement of the heating pipe embodying the present invention.

The description will be commenced by reference to FIG. 3 showing a preferred embodiment of the invention wherein the current trouble detecting system includes an additional power source 14, an additional ferromagnetic pipe 15 and an additional insulated wire 16 extending along and inside pipe 15 which all constitute a circuit hereinafter called "reference circuit". The description will be continued by reference to FIG. 5 showing a further circuit arrangement which embodies the principle of the invention most basically. FIG. 4 shows vectors of voltages and currents in the circuit of FIG. 3.

In FIG. 3, an insulated wire 8 is connected in series together with a ferromagnetic pipe 7 to a power source 9. They form a circuit hereinafter called "main circuit" through which current $i_1$ flows in a proper operative state thereof to heat and keep warm a pipeline not shown, for example. An additional insulated wire 16 is connected in series together with an additional ferromagnetic pipe 15 to an additional power source 14, and they form the reference circuit through which current $i_2$ flows. Reference numerals 12 and 13 identify connection wires, and 17 and 18 denote current transformers to measure currents $i_1$ and $i_2$ respectively. Reference numerals 10 and 10' are current difference detectors of which only one may be provided, preferably with the ability to detect the vector difference between currents $i_1$ and $i_2$, as will be described later.

Reference numeral 20 designates an impedance provided in the main circuit for current flow $i_1$ and interposed between one end of wire 8 and one end of pipe 7 opposite to power source 9. Impedance 20 is preferably a capacitor, as will be explained later.

Reference numeral 21 denotes an impedance preferably interposed between one end of wire 16 and pipe 15 opposite to the power source 14 for current flow $i_2$. Impedance 21 is also preferably a capacitor and may be omitted if the reference circuit is as short as several decameters.

FIG. 4 shows vectors of the voltages and the currents in the main circuit including power source 9, insulated wire 8 and pipe 7. Reference symbols used in the Figure are defined as follows:

Vs: voltage of power source 9 (expressed by segment $\overline{OS}$) with zero impedance (at 20) and with current $i_1$;

Vc: source voltage (expressed by segment $\overline{OC}$) with a capacitor employed as impedance 20 and with current $i_1$ (Vsc is the capacitor voltage under the same conditions);

Vl: source voltage (expressed by segment $\overline{OL}$) with a reactor employed as impedance 20 and with current $i_1$ (Vsl is the reactor voltage under the same conditions);

$\theta$s: phase difference between voltage Vs and current $i_1$ at power source 9 with zero impedance (at 20);

$\theta$c: phase difference between source voltage Vc and current $i_1$ with a capacitor used as impedance 20 and with capacitor voltage Vsc; and $\theta$l: phase difference between source voltage Vl and current $i_1$ with a reactor used as impedance 20 and with reactor voltage Vsl.

It is assumed here that impedances 20 and 21 are capacitors, and current $i_1$ equals current $i_2$. The respective vectors in FIG. 4 are in phase with respect currents $i_1$, $i_1'$, $i_1''$, $i_s$, etc.

Currents $i_1'$ and $i_1''$ are values to which current $i_1$ is changed when a dielectric breakdown occurs in a capacitor or a reactor which is used as impedance 20. Current $i_s$ is a faulty current resulting from a short circuit between wire 8 and pipe 7 due to a dielectric breakdown of wire 8.

Assuming that a dielectric breakdown occurred in capacitor 20 in the heating pipe system of FIG. 3, the phase difference between source voltage Vc and current $i_1$ is changed from $\theta$c to $\theta$s responsively to the change in source voltage Vc from $\overline{OC}$ to $\overline{OC'}$. Since the magnitude of this source voltage is Vs and not Vc, current $i_1$ will decrease to $i_1'$. If the decrease $\Delta i_1$, namely $i_1 - i_1'$, is larger than 2% of current $i_1$, it is detected by current difference detector 10 or 10'. A protective relay or a buzzer both not shown which is responsive to the current difference may be provided to open the main series circuit including wire 8 and pipe 7 or to give an alarm.

The next assumption is that a dielectric breakdown occurred in wire 8 at position 11 distant by x from the end as shown in FIG. 3, and wire 8 and pipe 7 are short-circuited. At that time, faulty current $i_s$ is expressed by:

$$i_s \approx i_1'/(1-x) \tag{3}$$

where the entire length of pipe 7 is 1 and the power source impedance is disregarded. If the current decrease $i_1 - i_1'$ is less than 2% of current $i_1'$ which is the detective limit of detector 10 or 10', faulty current is under $x \approx 0.02$ becomes:

$$i_s = i_1 \tag{4}$$

Therefore, current difference detector 10 or 10' is not operative merely with the difference between the absolute values of current $i_s$ and $i_1$.

It should be noted, however, that since voltage Vc before the current trouble and voltage Vs after the current trouble are equal in phase, current $i_1$ and faulty current $i_s$ are different in phase by:

$$\Delta\theta = \theta s - \theta c \tag{5}$$

Therefore, current difference detector 10 or 10' can detect the vector difference $\Delta i$ between current vectors $i_s$ and $i_1$ corresponding to phase difference $\Delta \theta$:

$$\Delta i = i_s - i_1 \quad (6)$$

If the value of expression (5) or (6) can be detected with $x=0.02$, it will be more readily detected when length x is larger than 0.02. This means that the detecting system can reliably detect a dielectric breakdown or short circuit at any point of wire 8 throughout the entire length thereof.

The said 2% as length x with respect to the entire length of pipe 7 is an exemplary value, and this x might be 5 through 10% under various structural restrictions.

Capacitor 21 provided in the reference circuit proximate to power source 14 to keep currents $i_1$ and $i_2$ in the same phase may be omitted provided detector 10 or 10' is adjusted so. Additionally, an increase of the capacitance of capacitor 20 enables omission of the reference circuit itself. FIG. 5 shows a circuit arrangement without the reference circuit. Here, current difference detector 30 or 31 may be an over-current relay. Reference numeral 32 denotes a conductive wire for voltage supply from power source 9 to detector 30.

The reference circuit proximate to power source 14 may be the circuit of another heating pipe system provided to heat a pipeline other than that to be heated by the main circuit of the present system. Alternatively, a reference circuit may be provided unique to the present system, by dividing one steel pipe prepared for one pipeline into two member parts 7 and 15 connected each other by a steel joint box, with insulated wires 8 and 16 extending from both sides of the joint box along and inside the respective member pipes 7 and 15, and with wire 13 connected to the bottom of the joint box (or to a steel pipe if the pipeline is made therefrom).

The aforegoing description refers to an embodiment wherein impedances 20 and 21 are capacitors. However, also with reactors employed as impedances 20 and 21 instead of capacitors, $\Delta \theta$ of expression (5) or $\Delta i$ of expression (6) can be detected as will be explained hereunder.

Referring to FIG. 4, assume that an insulation trouble occurred in reactor 20. Since source voltage V1 displaces from $\overline{OL}$ to $\overline{OL'}$, current $i_1$ displaces to $i_1''$. However, since the relation:

$$i_1'' > i_1 \quad (7)$$

is always valid, the problem as in expression (4) never occurs. Beside this, similarly to expression (3), faulty current $i_s$ is expressed by:

$$i_s = i_1''/(1-x) > i_1 \quad (8)$$

Therefore, a current trouble is detected, if reactor voltage Vsl is selected so that $\Delta i = i_1 - i_1''$ is equal to or larger than 2% of $i_1$. It is also useful to arrange so that detector 10 or 10' can detect the phase difference:

$$\Delta \theta = \theta_s - \theta_l \quad (9)$$

Similarly to the former arrangement wherein capacitors are used as impedances 20 and 21, it is also possible, when a reactor is employed as impedance 21, to omit the reactor and/or the reference circuit itself from the system.

Also, with use of resistances as impedances 20 and 21, current vector difference $\Delta i$ can be produced similarly to expression (6), or alternatively, phase difference $\Delta \theta$ can be produced similarly to expressions (5) and (9). Since resistances inserted in the circuit cause a continuous loss by circuit currents $i_1$, $i_2$, etc., it is usually disadvantageous, except in cases where the loss heat can be used for a specific purpose. For example, if pipes 7 and 15 are used to heat and keep warm a fuel heavy oil heating pipeline, it is usual to provide pumps or tanks at both ends. If these pumps or tanks need heat, the said loss heat due to employment of resistances may be effectively used.

Reactances, capacitors and resistors which are used individually in the aforegoing description may be combined with each other to serve as the said impedances.

Figure 1:
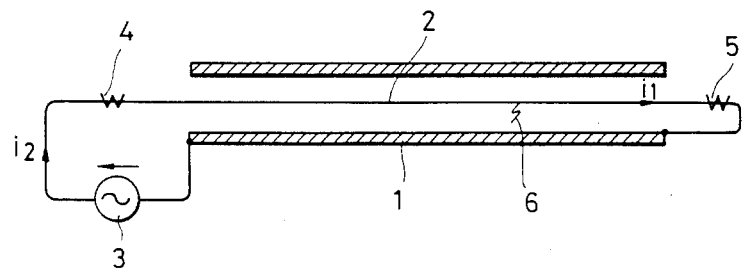
FIG. 1 shows a fundamental known arrangement of a series-connected, skin-current heating pipe system.
Figure 2:
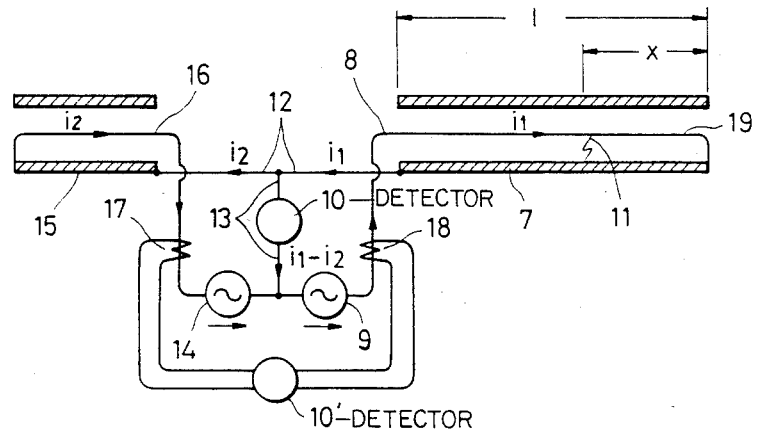
FIG. 2 shows the known circuit arrangement of a skin-current heating pipe system provided by Japanese Pat. No. 753,736.

As described above with reference to FIGS. 3 and 4, the invention permits detection of an insulation trouble at any point of insulated wire 8 or 16 throughout the entire length thereof, and hence ensures reliable protection or caution against all current troubles, whereas the prior art system of FIG. 2 is somewhat limited in its detection ability. Employment of capacitors as the impedances is particularly advantageous as compared to employment of reactors, because the power factor of the skin-current heating pipe circuit is increased from 85 through 90% to more than 90%, and also because source voltage Vc is decreased from Vs under no provision of capacitors, which results in a smaller capacitance of the power source transformer normally included in the power source and results in a lower insulation rating level of insulated wire 8.

It should be noted, as suggested before, that FIG. 4 shows vectors of currents $i_1$, $i_2$, $i_1'$, $i_s$, etc. as if they were in the same phase, in order to facilitate comparison between absolute values of respective currents. However, they must be in different phases respectively with respect to the source voltage. More specifically, it is the proper aspect that Vc is on $\overline{OC'}$ and V1 is on $\overline{OL'}$, which means they are in the same phase. Also, $i_1$ should have phase angle $\theta c$ with respect to the source voltage when capacitors are used, and should have phase angle $\theta l$ when reactors are used.

The embodiments of the invention in which an exclusive property or privilege is claimed are defined as follows:

1. A series-connected, skin-current heating pipe circuit comprising:
   (a) a first ferromagnetic pipe;
   (b) a first insulated wire extending along and inside said first ferromagnetic pipe;
   (c) a first a.c. source connected to one end of each of said first ferromagnetic pipe and said first insulated wire;
   (d) a first impedance element connected between the other end of each of said first ferromagnetic pipe and said first insulated wire; and
   (e) a current trouble detecting means provided in either line connecting said first a.c. source to said respective first ends of said first ferromagnetic pipe and said first insulated line to detect a current trouble due to an insulating trouble at any point of said first insulated wire.

2. A circuit according to claim 1 wherein said first impedance element is a capacitor.

3. A circuit according to claim 1 wherein said first impedance element is a reactor.

4. A circuit according to claim 1 wherein said first impedance element is a resistor.

5. A circuit according to claim 1 wherein said current trouble detecting means comprises a current trouble detector provided between said one end of the first insulated line and said first a.c. source.

6. A circuit according to claim 1 wherein said current trouble detecting means comprises a current trouble detector provided on a conductive wire connecting said first ferromagnetic pipe to said first a.c. source.

7. A circuit according to claim 1 wherein said current trouble detecting means includes a second a.c. source, a second ferromagnetic pipe, a second insulated wire extending along and inside said second ferromagnetic pipe, and a current trouble detector, and wherein said one end of said first ferromagnetic pipe is led via said second ferromagnetic pipe, said second insulated wire and said second a.c. source in this sequence to said first a.c. source, and said current trouble detector is connected between a line connecting said first and second ferromagnetic pipes and a wire connecting said first and second a.c. sources to detect a current flowing therein.

8. A circuit according to claim 1 wherein said current trouble detecting means includes a second a.c. source, a second ferromagnetic pipe, a second insulated wire extending along and inside said second ferromagnetic pipe, and a current trouble detector, and wherein said one end of said first ferromagnetic pipe is led via said second ferromagnetic pipe, said second insulated wire and said second a.c. source, in this sequence, to said first a.c. source, and said current trouble detector is connected between said first and second insulated wires to detect the difference in currents flowing in said respective wires.

9. A circuit according to claim 1 that also includes a second impedance element interposed between one end of said second ferromagnetic pipe and said second insulated wire which are more remote from said second a.c. source.

10. A circuit according to claim 9 wherein said second impedance element is a capacitor.

11. A circuit according to claim 9 wherein said second impedance element is a reactor.

12. A circuit according to claim 9 wherein said second impedance element is a resistor.

13. A circuit according to claim 8 further includes a second impedance element interposed between one end of said second ferromagnetic pipe and said second insulated wire which are more remote from said second a.c. source.

14. A circuit according to claim 13 wherein said second impedance element is a capacitor.

15. A circuit according to claim 13 wherein said second impedance element is a reactor.

16. A circuit according to claim 13 wherein said second impedance element is a resistor.

* * * * *

UNITED STATES PATENT AND TRADEMARK OFFICE
CERTIFICATE OF CORRECTION

PATENT NO. : 4,578,564
DATED : March 25, 1986
INVENTOR(S) : MASAO ANDO

It is certified that error appears in the above—identified patent and that said Letters Patent is hereby corrected as shown below:

On the title page the following should be added:

-- [30]   Foreign Application Priority Data
          September 14, 1983 [JP]
          Japan 170286   --.

Signed and Sealed this

Twenty-ninth Day of July 1986

[SEAL]

Attest:

DONALD J. QUIGG

Attesting Officer    Commissioner of Patents and Trademarks